US012575059B2

(12) United States Patent
De Klein

(10) Patent No.: US 12,575,059 B2
(45) Date of Patent: Mar. 10, 2026

(54) SYSTEM AND METHODS FOR THE INDIVIDUAL IMMERSION COOLING OF HARDWARE COMPONENTS

(71) Applicant: Liqomi B.V., Grave (NL)

(72) Inventor: Christianus Theodorus De Klein, Grave (NL)

(73) Assignee: LIQOMI B.V., Grave (NL)

( * ) Notice: Subject to any disclaimer, the term of this patent is extended or adjusted under 35 U.S.C. 154(b) by 114 days.

(21) Appl. No.: 18/709,690

(22) PCT Filed: Nov. 11, 2022

(86) PCT No.: PCT/EP2022/081672
§ 371 (c)(1),
(2) Date: May 13, 2024

(87) PCT Pub. No.: WO2023/084052
PCT Pub. Date: May 19, 2023

(65) Prior Publication Data
US 2025/0008686 A1      Jan. 2, 2025

(30) Foreign Application Priority Data
Nov. 12, 2021      (NL) ...................................... 2029728

(51) Int. Cl.
*H05K 7/20* (2006.01)

(52) U.S. Cl.
CPC ..... *H05K 7/20236* (2013.01); *H05K 7/20272* (2013.01); *H05K 7/203* (2013.01); *H05K 7/20772* (2013.01); *H05K 7/20781* (2013.01)

(58) Field of Classification Search
CPC ........... H05K 7/20236; H05K 7/20272; H05K 7/20781; H05K 7/20772; H05K 7/203;
(Continued)

(56) References Cited

U.S. PATENT DOCUMENTS 9,223,360 B2      12/2015      Attlesey
11,116,113 B2*      9/2021      Chiu .................... H05K 7/2039
(Continued)

FOREIGN PATENT DOCUMENTS

CN      209314181 U      8/2019
CN      110631301 A      12/2019
(Continued)

OTHER PUBLICATIONS

Ozyalcin et al., Methods and System for Oil Immersion Cooling, Oct. 25, 2017, PE2E Search (Year: 2017).*
(Continued)

*Primary Examiner* — Michael A Matey
(74) *Attorney, Agent, or Firm* — Leason Ellis LLP

(57) ABSTRACT

The invention relates to an immersion cooling system for controlling the temperature of a heat generating hardware component. The immersion cooling system supplies cooling liquid to a reservoir that has hardware component positions. In that reservoir the cooling liquid is held and hardware component are immersed. A cooling liquid recovery allows discharge of cooling liquid. The hardware is held in positions that are positioned in a flow path of the cooling liquid from the one or more supply points to the outlet. The supply can be adapted to the hardware component. e.g. a heat profile of the hardware component in use. Extra supplies can be provided when extra hardware components are added. And distal parts of the supply can be removed and closed if hardware component are removed from the reservoir. The cooling liquid supply has one or more nozzles for each multiple hardware positions, the one or more nozzles configured to supply cooling liquid directed at the hardware position of the hardware component.

14 Claims, 11 Drawing Sheets

(58) Field of Classification Search
CPC .......... H05K 7/20263; H05K 7/20281; H05K 7/20809; H05K 7/20327; H05K 7/20818; H05K 7/20645; H05K 7/20836; G06F 1/20; G06F 2200/201; H01L 23/4735; H01L 23/473; C23C 16/45578
See application file for complete search history.

(56) References Cited

U.S. PATENT DOCUMENTS

| | | | |
|---|---|---|---|
| 2010/0326357 A1* | 12/2010 | Huang | C23C 16/45578 |
| | | | 118/724 |
| 2017/0051409 A1* | 2/2017 | Noh | C23C 16/45578 |
| 2017/0265328 A1 | 9/2017 | Sasaki et al. | |
| 2017/0311484 A1 | 10/2017 | Ozyalcin et al. | |
| 2017/0354061 A1* | 12/2017 | Saito | G06F 1/206 |
| 2018/0020571 A1* | 1/2018 | Saito | H05K 7/20636 |
| 2019/0090383 A1 | 3/2019 | Tufty et al. | |
| 2019/0093224 A1* | 3/2019 | Yoshida | C23C 16/45502 |
| 2020/0257342 A1* | 8/2020 | Mao | G06F 1/20 |
| 2020/0352058 A1* | 11/2020 | Zhong | H05K 7/20781 |
| 2021/0321534 A1 | 10/2021 | Amos et al. | |

FOREIGN PATENT DOCUMENTS

| | | |
|---|---|---|
| CN | 111328248 A | 6/2020 |
| CN | 111356337 A | 6/2020 |
| CN | 111629570 A | 9/2020 |
| EP | 0480750 A2 | 4/1992 |
| EP | 3460626 A1 | 3/2019 |
| EP | 3706523 A1 | 9/2020 |
| WO | 0101741 A1 | 1/2001 |
| WO | 2019060576 A2 | 3/2019 |
| WO | 2022129889 A1 | 6/2022 |

OTHER PUBLICATIONS

Chaianov et al., Immersion Cooling System, Oct. 28, 2020, PE2E Search (Year: 2020).*
International Search Report for corresponding PCT Application No. PCT/EP2022/081672 issued on Feb. 15, 2023 (5 pages).
Search Report for corresponding Application No. NL 2029728 issued on Dec. 18, 2021 (31 pages).

* cited by examiner

SYSTEM AND METHODS FOR THE INDIVIDUAL IMMERSION COOLING OF HARDWARE COMPONENTS

CROSS-REFERENCE TO RELATED APPLICATIONS

This application is a U.S. National Stage Application under 35 U.S.C. § 371 of International Patent Application No. PCT/EP2022/081672, filed Nov. 11, 2022, which claims priority to Netherlands Patent Application No. 2029728, filed Nov. 12, 2021, the contents of which are each hereby incorporated by reference in their respective entireties.

TECHNICAL FIELD

This invention generally relates to the field of cooling of computer components and related electronics. In particular, the present disclosure relates to a system and methods for cooling a hardware component using immersion cooling.

BACKGROUND

In computing and electronics, processing units heat up when in use.

Air cooling is a method of dissipating heat, usually by increasing the flow of air over the object to be cooled. In computing and electronics, and in particular in datacenters, air cooling is used to cool the computer hardware and to keep the hardware at a specific operating temperature.

Cooling using air has some disadvantages. Firstly, cooling the air used for cooling and optimizing the air flow makes for high running costs, usually about 15-20% or more of the total running cost of a modern datacentre. Secondly, the computer hardware is negatively affected by oxidation and dust particles, the latter nestling itself in and on the hardware and continuously being circulated throughout the datacentre. Air filters are used to clean the used air, but these require maintenance. Thirdly, the cooling air can be moist which can cause short-circuiting in the hardware. A moisture absorber can be used to combat this problem, but again these require maintenance. Finally, cooling air has a limited and relatively low heat capacity and thus only has the capacity to dissipate a limited amount of heat.

Liquid cooling refers to cooling/temperature control by means of (heat transfer and subsequent) convection or circulation of liquid. One example of liquid cooling is immersion cooling, which is a cooling method by which computer components and other electronics, including complete servers and storage devices, are immersed in a thermally conductive dielectric liquid or coolant within a reservoir. Heat is removed from the hardware components or other electronics by circulating liquid into direct contact with hot components. Heat will be transferred into the liquid, the heated liquid is transported, after which the transported liquid is brought into contact with a heat exchanger for cooling it again. Because the cooling liquid chosen in immersion cooling has a higher heat capacity than air, heat is more easily dissipated from the hardware components into the cooling liquid. However, there are some downsides to the immersion cooling systems known from the prior art.

Liquid supply is usually performed in bulk to the reservoir wherein the different hardware components are immersed. Often simple circulation, supplying cooling liquid globally at the bottom of the reservoir and recovering the heated cooling liquid at the top, is used to dissipate heat into the cooling liquid. The flow of the liquid through the reservoir is therefore difficult to control. When using a simple circulation, reaching the parts of the components that require most cooling, requires operating the liquid supply at a high operating pressure.

Furthermore, cooling liquid can be recirculated from the surface of the liquid pool in the reservoir back into circulation. This makes control of the temperature of the cooling liquid more difficult and less energy efficient.

Hotspots on certain hardware components, i.e. places where a hardware component locally generates a lot of heat and which often need to be extra cooled, can be difficult to reach. In order to make sure that all hotspots are cooled properly and effectively, the flow rate of the cooling liquid needs to be increased or the cooling temperature will have to be decreased, but at the cost of more energy. Different hardware components will have different cooling needs, however it is not possible to take these different cooling needs into account properly and fully.

The known systems are usually difficult to scale up or down since often the amount of heat that can be dissipated in a reservoir unit goes down if the number of connected reservoir units goes up. Furthermore, heat exchangers are often built into a single reservoir unit.

It is therefore an object of the invention to solve the abovementioned problems relating to immersion cooling and to improve the control over the cooling process, efficiency and scalability of these systems.

US2020/257342 discloses a liquid immersion system that has a manifold with nozzles connected thereto. CN 111 328 248 discloses a bottom-side liquid supply system formed by a plenum with outlets, the disclosed system lacking any individual control. WO2019/060576 discloses a housing with a column of electronic devices of trays with a weir having a manifold that delivers liquid at the respective heights of the electronic devices. Similar to WO 2019/060576, U.S. Pat. No. 9,223,360 discloses electronic devices in cassettes. EP 3 706 523 discloses an immersion system with a manifold positioned at the bottom with outlets that are directed upwards.

SUMMARY

To address the above discussed draw backs of the prior art, in a first aspect an immersion cooling system for controlling the temperature of a heat generating hardware component. In use the temperature will increase of the heat generating hardware. In embodiments, the immersion system maintains a desired temperature. The immersion system will cool the hardware. In embodiments, the immersion cooling system comprises a reservoir, a cooling liquid supply and recovery to and from the reservoir. This aspect can be combined with any of the other features disclosed herein.

In an embodiment, a reservoir for holding a cooling liquid is provided. In the reservoir the hardware component can be immersed. Multiple hardware positions can be present in the reservoir. The reservoir can have multiple slots. The hardware positions in the reservoir are positioned such that a flow path of the cooling liquid passes the hardware positions.

In embodiments a cooling liquid supply is provided. The cooling liquid is supplied into the reservoir and comprises one or more nozzles. The cooling liquid supply comprises the ducts to provide the immersion liquid. At a downstream end of the supply, the liquid is released, via one or more nozzles, to the reservoir. Nozzles in this application can be a low complexity exit from the duct or can be more complex and configurable. The cooling liquid supply has one or more nozzles for each of the multiple hardware positions. Accordingly at each hardware position there is an individual nozzle for supplying liquid. According to embodiments of the invention, the one or more nozzles are configured to supply cooling liquid directed at the hardware position of the hardware component. Accordingly, each hardware at each position is supplied with cooling liquid and the direction of supply can be configured, e.g. dependent on the actual hardware at that hardware position. This allows for improved cooling. This allows the liquid supply at one hardware position to be different from the liquid supply at a different hardware position.

Hardware positions, although present, do not have to contain a hardware. In case hardware is not positioned at a hardware position, the cooling liquid supply can be without a (configured) nozzle at that unoccupied hardware position.

In embodiments a cooling liquid recovery is provided. The recovery allows cooling liquid from the reservoir to be collected. An outlet is provided. The outlet can be a drain or weir. Continuous supply and recovery is preferred.

In embodiments, the one or more nozzles are configurable nozzles. In such embodiments, it is the most downstream element of the supply that can be configured. In embodiments the one or more nozzles of the cooling liquid supply are configured differently, preferably set at different angles at which the nozzle supplies cooling liquid. Other configurable properties of the nozzles can be the diameter of the nozzle and/or the spray type of the nozzle. This allows adapting the individual supply of cooling liquid to the hardware positioned at a hardware position. In embodiments, the one or more nozzles are directed at a first hardware position are configured different from the one or more nozzles directed at a second hardware position. In embodiments the one or more nozzles are directed at predetermined locations of the hardware positions. More preferably the predetermined location is based on a heating profile of the hardware component in use. A heating profile of a hardware can be obtained by testing and collect how heat is generated in use of the hardware. The nozzles can be set to direct a flow of the cooling liquid dependent on the geometrical shape of the hardware component at the hardware position.

In embodiments, the cooling liquid supply comprises a manifold. The manifold allows distributing the supplied cooling liquid in multiple separate streams of liquid. The manifold extends along multiple hardware positions. Preferably, the manifold is extends along the hardware positions outside of the liquid reservoir and has outlets at respective hardware positions. Preferably, the liquid reservoir is a bath that is open at a top side, wherein hardware positions are formed adjacent and the manifold extends along an edge of the open top side of the liquid reservoir outside of the liquid reservoir. The outlets of the manifold are positioned outside the liquid reservoir. The outlets are thus easily accessible. The outlets or liquid supply ports of the manifold can be closed off. The manifold can then provide the liquid streams at each hardware position. The manifold is arranged to be coupled with nozzle carrying parts, which will form the downstream parts of the cooling liquid supply. The nozzle carrying part is connected to the outlet and extends into the liquid reservoir, preferably from the top side along the side wall of the liquid reservoir and reach underneath the hardware to supply liquid via the nozzle directed at the hardware.

In embodiments wherein the nozzle carrying part has a channel. The channel allows to receive and supply liquid.

The nozzle carrying part has an inlet. The inlet is connectable to the outlet of the manifold. In connected state the nozzle carrying part, liquid from the manifold is distributed through the manifold outlet into the channel of nozzle carrying part. The nozzle carrying part has at least one configurable nozzle connected to the channel. This allows the supplied liquid to exit the nozzle carrying part via the configurable nozzle.

The nozzle carrying part has first dimensions. The channel has a length. The channel allows to bring the supplied cooling liquid from the manifold outlet to a position at a distance from the manifold to the configurable nozzle.

In embodiments the immersion cooling system will have a manifold that has a first outlet at a first hardware position and a second outlet at a second hardware position. The outlets are connectable to a first and a second nozzle carrying part respectively. The first and second nozzle carrying part have different dimensions, e.g. channels of different length or different nozzles. The length or nozzle of the nozzle carrying part is adapted to the respective different hardware to be positioned at the first and second position. The system of the invention allows to adapt the liquid supply, and in particular the downstream end of the liquid supply comprising the nozzles that direct the liquid in the liquid container and at the hardware, to be configurable. Not only can the spray pattern be adapted to the hardware, also the liquid supply, and in particular the nozzle carrying part that is connected to the manifold, be adapted to the size of the hardware to be positioned in the hardware slots.

In embodiments, the nozzle carrying part is L-shaped, having a L-shaped channel. In embodiments, wherein the inlet of the channel of the L-shaped nozzle carrying part is formed in one part of the L-shaped nozzle carrying part and a nozzle is connected to the channel on the other part of the L-shaped nozzle carrying part.

In embodiments, the cooling liquid supply, and in particular the nozzle carrying part, has a vertical part positioned along a wall of the reservoir. In embodiments the supply duct extends along the entire length of the vertical part. This allows supply the liquid in ducts from a top side of the reservoir. Preferably hardware positions are adjacent and two cooling liquid supplies have different lengths of the vertical part. Nozzles can be present on the vertical part. The nozzle can be directed at the hardware position. To spray in the direction of the hardware, the nozzle is directed in a sideward direction.

In embodiments, the cooling liquid supply, and in particular the nozzle carrying part, has a horizontal duct part that has one or more nozzles directed at the hardware position. Those nozzles are mostly directed upward. In embodiments, the horizontal duct part is connected to a distal end of the vertical part, the horizontal part preferably extending underneath the hardware position. This allows providing cooling liquid from a side of the hardware, along a vertical direction and from a bottom side of the hardware. This allows reaching the hot spots of the hardware. In embodiments the horizontal part is positioned along the entire length, or substantially the entire length, of the hardware position or a second side face of the hardware component.

The reservoir has hardware positions. In embodiments, the hardware positions are adjacent positions, forming a row of hardware components, wherein a top side of the hardware positions is near a surface of the immersion liquid held in the reservoir. The reservoir can be accessible or open from a top side. Additional hardware can be added or hardware can be removed from the hardware position via this top side of the reservoir, not requiring emptying the liquid from the reservoir. In case of adding hardware components, extra distal supply parts can be added and an extra supply port can be opened to supply liquid to the added hardware component. In case of removing hardware components, distal supply parts can be removed and an supply port can be closed off to prevent the supply of liquid to the position of the removed hardware component.

In embodiments, the manifold has pre-formed outlets or ports at multiple hardware positions, the outlets arranged for coupling to individualized nozzle carrying parts of the cooling liquid supply. The manifold outlets or ports are opened/closed dependent on the presence of a hardware component at the corresponding hardware position. Each hardware position can have one or more manifold ports.

In embodiment, the outlet of the recovery comprises an overflow weir for draining liquid from the reservoir, wherein preferably the overflow weir comprises a vertical wall structure and an overflow lip. In embodiments, outlet comprises at least two overflow weirs for draining liquid from the reservoir, wherein a top side of a generally rectangular shaped reservoir is surrounded, at least on two sides, by the at least two overflow weirs.

In further embodiments and/or according to a further aspect of the invention, an immersion system comprising a reservoir, supply and recovery are provided, the reservoir having hardware positions, the hardware can be inserted in the hardware position from the top side, the hardware will extend toward the bottom of the reservoir. The reservoir will have a depth. If the hardware is relatively short, the lowest end of the hardware in the hardware position can be positioned at a distance from the bottom of the reservoir. In embodiments of the invention, a filler body can be placed in a space between a bottom side of the immersed hardware component and a bottom of the reservoir. A height of the filler body correlates with a distance between the bottom side of the hardware component and the bottom of the reservoir, wherein the filler body fills that distance for the most part. This will fill up the space between bottom of the reservoir and bottom of the hardware, reducing the volume of immersion liquid in the reservoir. This in turn allows to more closely control the temperature. The cooling liquid in the reservoir is quicker replace and dead volumes that collect cooling liquid in the reservoir are reduced. This aspect can be combined with any of the other features disclosed herein.

In embodiments, the filler body comprises polypropylene which is resistant to the cooling liquid and the temperature of the cooling liquid in the reservoir, preferably 70 degrees Celsius or more. In embodiments, one or more nozzles of the cooling liquid supply filler body are positioned between the filler body and the hardware component.

The reservoir can have slots for the hardware. The reservoir can have a groove extending vertically along a side wall of the reservoir, the groove receiving a part of the cooling liquid supply. The reservoir comprises multiple grooves extending vertically along a side wall of the reservoir forming at multiple hardware component positions a holding space for a side edge of the hardware component. In embodiments both the reservoir and the filler body have a tongue-and-groove joint for positioning the filler body.

In further embodiments or according to a further aspect of the invention, a modular immersion system is provided. The cooling liquid supply has a first reservoir connection point configured to be connectable to a second reservoir connection point of a second reservoir.

According to a further aspect, a method for cooling a hardware component is provided. The method comprises supply cooling liquid and recovering cooling liquid from a reservoir with hardware positions. According to the invention the liquid supply is individualised, that is the supply at a hardware position can be adjusted or configured dependent on the hardware at the hardware position. This aspect can be combined with any of the other features disclosed herein.

In embodiments, the hardware component is positioned at the hardware position. The hardware component is immersed in the cooling liquid in the reservoir and subsequently cooled during use.

In embodiments of the method one or more nozzles of the cooling liquid supply are set, preferably directed, based on a heating profile of the hardware component. Preferably the nozzles are directed at predetermined locations that relate to a hotspot in the heating profile of the hardware component.

According to yet a further aspect of the invention, a method for cooling a hardware component is provided, the method comprising providing a reservoir for a cooling liquid; supplying cooling liquid supply into the reservoir; immersing one or more hardware components in the cooling liquid held in the reservoir; recovering cooling liquid from the reservoir; and adapting the supply of cooling liquid dependent on the immersed hardware component. This too allows adapting the supply to the immersed hardware. This aspect can be combined with any of the other features disclosed herein.

In embodiments, before (or together or after) immersing the hardware component one or more nozzles are added to the cooling liquid supply. At empty hardware positions in the reservoir, hardware can be added. The empty hardware position also allows positioning a downstream end of the supply at the hardware position. The downstream end can be positioned before, together or after positioning the hardware.

In this application 'inlet' and 'outlet' refer to features of the immersion bath. The inlet of the bath is the outlet of the cooling liquid supply system. In embodiments, the inlet supplies cooling liquid to the hardware component individually, that is there are different supplies/inlets for each hardware component. In embodiments supplying the cooling liquid comprises supplying the cooling liquid directed at the hardware component from a sideways position and/or from below.

According to yet another aspect, a method for cooling a hardware component is provided, wherein a reservoir for holding a cooling liquid is provide, cooling liquid is supplied into the reservoir and one or more hardware components are immersed in the cooling liquid and cooling liquid is recovered from the reservoir. According to the invention, a filler body is positioned in the reservoir between a bottom of the hardware component and a bottom of the reservoir. This fills the space between bottom of the hardware and the bottom of the reservoir. This aspect can be combined with any of the other features disclosed herein.

According to an aspect, an immersion cooling system for controlling the temperature of a heat generating hardware component is provided, the immersion cooling system comprising a reservoir, a cooling liquid supply and a cooling liquid recovery. The reservoir has multiple hardware positions to receive multiple hardware components, the hardware positions being positioned in a flow path of the cooling liquid from the one or more supply points to the outlet. The immersion cooling system further comprises a filler body to be placed in or under a hardware position. This aspect can be combined with any of the other features disclosed herein.

In embodiments, the filler body fills a space between a bottom side of the immersed hardware component and a bottom of the reservoir. This reduces the volume of cooling liquid. Preferably a height of the filler body correlates with a distance between the bottom side of the hardware component and the bottom of the reservoir, wherein the filler body fills that distance for the most part.

Yet a further aspect of the invention is a method for cooling immersed hardware components, wherein a reservoir is provided, cooling liquid is supplied into the reservoir, one or more hardware components are provided in the cooling liquid, and heat profiles of one or more hardware components in use are provided. Accordingly, the supply of cooling liquid directed at a first hardware component is configured dependent on the first heat profile. The supply of cooling liquid directed at a second hardware component is configured dependent on the second heat profile, different from the first heat profile. This allows individualised spray patterns for cooling. This aspect can be combined with any of the other features disclosed herein.

Still, another aspect is the provision of an immersion cooling system for controlling the temperature of a heat generating hardware component, the immersion cooling system comprising a reservoir, a cooling liquid supply and a cooling liquid recovery. According to this aspect a manifold is provided as part of the cooling liquid supply. The manifold has multiple connection points for or at each hardware position. The manifold thus allows splitting the supplied cooling liquid in different streams for each hardware position. This aspect can be combined with any of the other features disclosed herein.

In embodiments, the cooling liquid supply comprises a downstream supply part having one or more nozzles arranged to be connected to the connection point of the manifold, the one or more nozzles configured to supply cooling liquid directed at the hardware position of the hardware component.

Any of the above features and features disclosed in the detailed description of the figure can be combined. The invention encompasses any of the explicit, but also implicit disclosures in relation to the current text. Divisional applications can be filed directed at any combination of features disclosed herein.

BRIEF DESCRIPTION OF DRAWINGS

Embodiments will now be described, by way of example only, with reference to the accompanying schematic drawings in which corresponding reference symbols indicate corresponding parts, and in which.

The figures are intended for illustrative purposes only, and do not serve as restriction of the scope or the protection as laid down by the claims.

DESCRIPTION OF EMBODIMENTS

Figure 1:
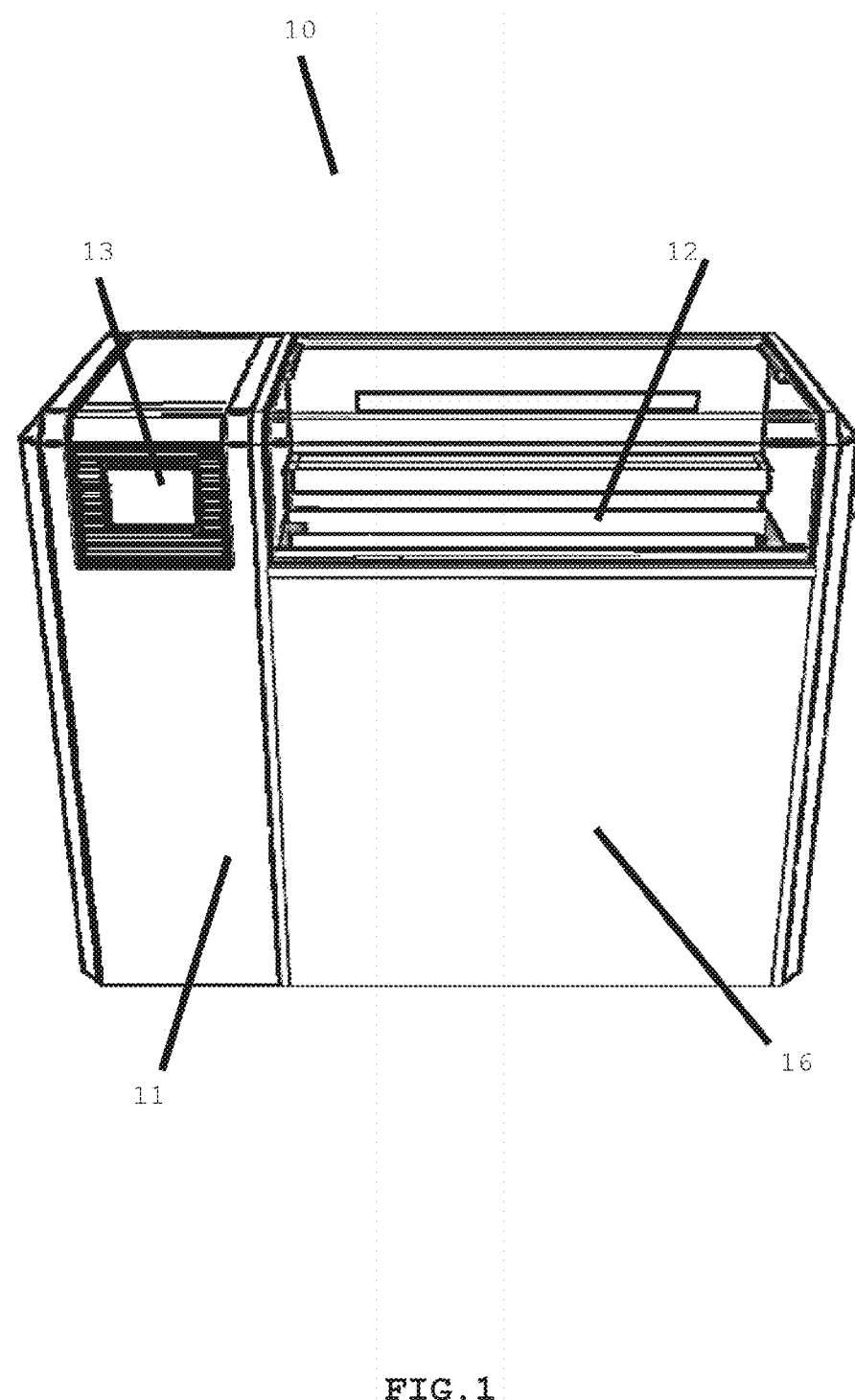
FIG. 1 schematically illustrates an exemplary immersion cooling system according to the present invention.

Hereinafter, certain embodiments will be described in further detail. It should be appreciated, however, that these embodiments may not be construed as limiting the scope of protection for the present disclosure. FIG. 1 schematically illustrates an exemplary immersion cooling system 10 according to the present invention.

The immersion cooling system 10 comprises a housing part 11 for a control unit and a reservoir 12 in a housing 16. The control unit is arranged to control the temperature control of different hardware components immersed in the liquid held in the reservoir 12. The control unit is a modular unit comprising one or more devices that can control, directly or indirectly, the flow and temperature of the cooling liquid. The control unit can e.g. comprise a pump, a heat exchanger, different sensors arranged in the tubings, a valve for controlling the inflow of cooling liquid, and a programmable logic controller which can automatically control the different devices based on user settings and sensor output. To that end, a user interface 13 is provided. The user interface 13 can be a touch display. The user interface 13 provides control of the different settings of the immersion cooling system 10 and especially of the control unit. Furthermore, the user interface 13 can show status updates of relevant parameters, e.g. the temperature of the cooling liquid in the reservoir, and/or the temperature of a hardware component.

The reservoir 12 holds cooling liquid. As cooling liquid, a thermally, but not electrically, conductive liquid can be used. Some examples are transformer oils, synthetic single-phase, dual phase dielectric coolants such as 3M Fluorinert or 3M Novec, or mineral oils. Non-purpose oils, including cooking-, motor- and silicone oils, can also be used. In general, a dielectric liquid with good thermal properties, e.g. high thermal capacity, can be used as a cooling liquid.

Hardware components are immersed in the cooling liquid. The reservoir 12 will have multiple hardware positions for hardware components. The one or more hardware components are held at predetermined hardware positions. The hardware components are preferably mounted generally vertically, by inserting them into the reservoir from the open top side of the reservoir 12. The hardware positions are vertical slots positioned adjacent one and other.

The immersion system 10 and specifically the reservoir 12 comprise a cooling liquid supply and discharge. Tubes serve to supply cooling liquid to the reservoir 12. The control unit is connected to the cooling liquid supply and discharge. This allows controlling the supply and discharge. The cooling liquid supply has one or more nozzles that direct the cooling liquid from the supply into the cooling liquid already present in the reservoir 12.

Not visible in FIG. 1 are the hardware positions. The hardware positions can be predetermined. E.g. grooves can be formed in a sidewall of the reservoir. Several hardware components can be immersed in the cooling liquid held in the reservoir 12. In embodiments the hardware components are vertically positioned. In embodiments the multiple vertical hardware positions are aligned from left to right in FIG. 1.

The nozzles of the cooling liquid system are positioned in close proximity of and directed at the hardware component held in the hardware positions. Multiple nozzles can be directed at one hardware component.

In embodiments the one or more nozzles for one hardware position are positioned on a downstream supply part. Each hardware position can have at least one downstream supply part. The downstream supply part can be a configurable part: nozzles of the downstream supply part can be set or configured dependent on the hardware component that is to be cooled.

In embodiments where the heat profile of the hardware component is known and the hardware position of the hardware component is known, the one or more nozzles of the downstream supply part can be set in accordance with the heat profile. In embodiments a nozzle with a relatively large opening for supply a relatively large amount of cooling liquid per time frame can be directed at hot spots according to the heat profile. Also the position of the one or more nozzles can be configured. In embodiments the distance between nozzle and a hot spot can be reduced. A nozzle with a wide area exit flow can be directed at non-hot spots.

Not visible in FIG. 1 is the cooling liquid supply comprising a manifold. The manifold can have connection points. The manifold can be arranged to have a connection point for each hardware position. In case a hardware component is positioned at the hardware position, a configurable downstream supply part can be connected to the connection point to allow cooling liquid to flow in the downstream supply part and to be distributed by the nozzles thereof to one or more desired cooling liquid supply points in proximity to the hardware component.

The immersion cooling system 10 can comprise multiple separate reservoirs 12 each connected to the control unit 11, either in parallel or in series. One or more reservoirs 12 of different sizes and shapes are received in a housing 16. The one or more reservoirs 12 can be connected to a single control unit 11.

In embodiments, the immersion cooling system 10 is modular. In further embodiments multiple housings 16 can be connected to each other. In such embodiment the one or more control units can cooperate with each other, or one control unit controls several cooling liquid supplies of coupled reservoirs. This allows multiple reservoirs, of different sizes to be coupled. Example of different sized reservoirs are reservoirs that fit 19-inch hardware and other reservoirs that fit 21-inch hardware. Accordingly in a modular system, several 19 inch reservoirs and several 21 inch reservoirs can be coupled. Coupling of reservoirs in a modular system comprises especially sharing of the supply and/or the recovery parts of the immersion system. In particular one pump and one heat exchangers are used for multiple reservoirs, in particular multiple differently sized reservoirs.

Not shown in FIG. 1 is the cooling liquid recovery that will recover cooling liquid from the reservoir to cool that liquid again to a desired temperature and supply the cooling liquid again. This allows a continuous cycle.

Figure 2:
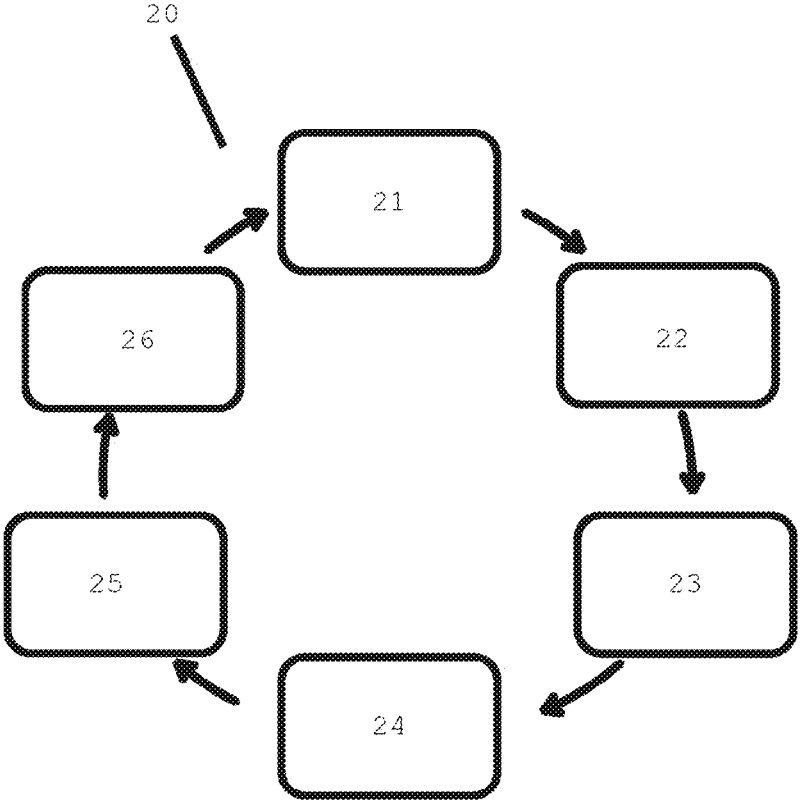
FIG. 2 illustrates an exemplary cooling cycle of cooling liquid in an exemplary immersion cooling system according to the present invention.

FIG. 2 illustrates an exemplary cooling cycle 20 of cooling liquid in an exemplary immersion cooling system 10 according to the present invention.

In step 21, the cooling liquid having a desired temperature is pressurized and supplied into ducts of the cooling liquid supply. In embodiments the cooling liquid is fed to a manifold. That manifold has connection points that at least partially corresponds to positions where hardware components can be placed. Those connection points can be connected to individualized downstream supply parts.

In step 22, the cooling liquid flows into the downstream supply part. The individualized downstream supply parts allow supplying the cooling liquid from the manifold via the downstream supply part towards each of the hardware components positioned in the cooling liquid held by the reservoir. Due to the higher pressure the cooling liquid flows downstream towards a configurable downstream supply part comprising one or more nozzles directed at the hardware components. The nozzles supply the cooling liquid directed at the hardware component in a configurable manner adapted to the respective size and/or heat profile of the hardware component to be cooled.

At each hardware position a downstream supply part can be provided. The configurable downstream supply art allows, for each hardware component, supplying the cooling liquid in an individual manner to the cooling requirements of the immersed hardware component.

The one or more downstream supply parts supply the cooling liquid in the reservoir to each of the hardware components. The downstream supply part is configured to position the one or more nozzles of the injection structure in close proximity of the hardware component such that a nozzle of the injection structure supplies cooling liquid directly to the hardware component at a predetermined location of the hardware component.

In this application a nozzle positioned at a bottom side of the to-be-cooled hardware, which nozzle would be spraying generally upwards, towards the to-be-cooled hardware is positioned in close proximity if the distance between nozzle end and the part to be cooled and sprayed is more than 1 cm and/or less than 20 cm, preferably more than 2 cm and/or less than 17.5 cm, more preferably more than 2.5 cm and/or less than 15 cm, and even more preferably more than 3 cm and/or less than 12.5 cm. In embodiments the minimum distance between nozzle end and part to be cooled is at least 3.5 cm, preferably 3.9 cm. Nozzles positioned at close proximity, preferably at less than 10 cm are full-cone nozzles, which are nozzles having a wide spraying pattern.

In this application a nozzle positioned along a side of the to-be-cooled hardware, which nozzle would be spraying generally horizontal, towards the to-be-cooled hardware is positioned in close proximity if the distance between nozzle end and the part to be cooled and sprayed is more than 0.5 cm and/or less than 15 cm, preferably more than 0.9 cm and/or less than 12 m, more preferably more than 1.4 cm and/or less than 9 cm, and even more preferably more than 1.7 cm and/or less than 7 cm. In embodiments the minimum distance between nozzle end and part to be cooled is at least 1.8 cm, preferably 1.9 cm. Horizontal directed nozzles positioned at close proximity, preferably at less than 4 cm are V-shaped nozzles, such nozzles having a compact pattern. The generally horizontally spraying nozzles are directed towards the hardware, directed at an area under the to-be-cooled hardware or hot-spot.

In embodiments, one or more nozzles on a generally vertically directed part of the manifold or cooling liquid supply part have a V-shaped nozzle, whereas one or more nozzles on a generally horizontal part of the manifold or cooling liquid supply part have cone-shaped nozzle.

In embodiments, one or more nozzles that are directed to spray cooling liquid generally horizontally have smaller exit diameter than nozzles that are generally directed more vertically. The horizontal directed nozzles are to spray more directed at a hotspot, whereas the vertically directed nozzles are to spray over larger surface areas of the hardware.

In step 23, the cooling liquid is present in the reservoir 12. After heat transfer of the cooling liquid with the hardware component, the heated cooling liquid will flow through the reservoir inter alia based on the thermal profile of each of the hardware components, producing currents in the reservoir. Furthermore, the cooling liquid flows through the reservoir based on the flow originating from the one or more injection structures.

In step 24, the cooling liquid is recovered from the reservoir 12 using a cooling liquid recovery. This can be done using an overflow weir for draining used cooling liquid from the reservoir 12 once the cooling liquid in the reservoir 12 reaches a certain height/amount.

In step 25, the recovered cooling liquid is pumped away from the recovery using liquid pumps.

As a result of the liquid pump of step 25, in step 26, the recovered cooling liquid is supplied to a heat exchange element. Heat is extracted from the recovered cooling liquid, to bring the cooling liquid to a desired temperature for entering the pressure duct again of step 21.

If there is more than one reservoir, the cooling liquid can flow from one reservoir to the next, preferably being cooled between being supplied to each reservoir. In the alternative, each reservoir can have its own cooling cycle 20. Parts of each cooling cycle 20 can be shared among multiple reservoirs. For example, all cooling cycles can make use of the same cooling line and/or all cooling cycles can have a shared recycling of the cooling liquid.

Figure 3:
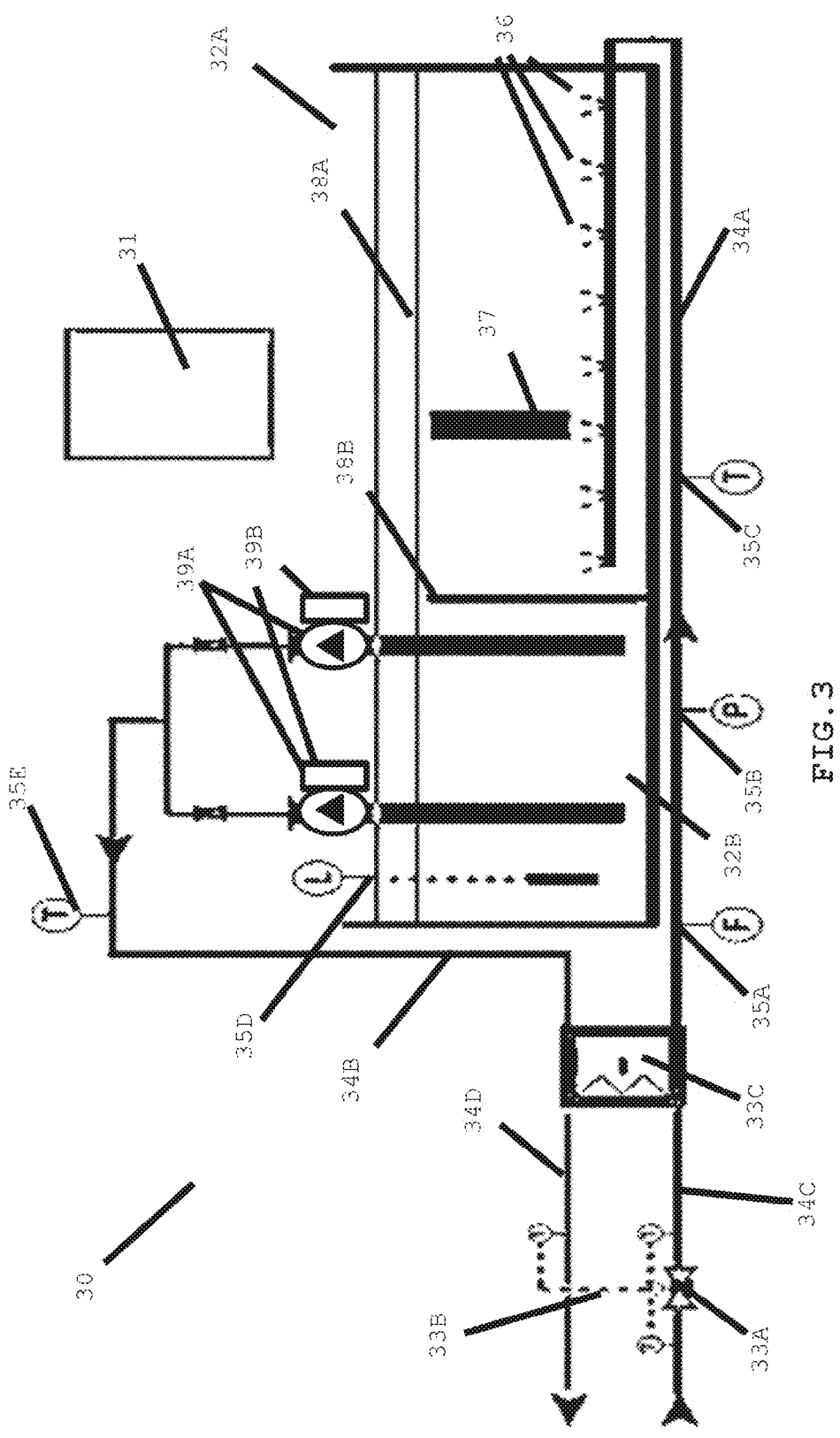
FIG. 3 schematically illustrates an inlet and outlet of an immersion cooling system according to the present invention.

FIG. 3 schematically illustrates the cooling liquid supply 34A and recovery 34B of an immersion cooling system 30 according to the present invention. Immersion cooling system 30 comprises a reservoir 32A filled with cooling liquid.

Hardware component 37 is immersed in the reservoir 32A at a hardware position.

The cooling liquid flows through a supply duct with multiple nozzles 36 into the reservoir 32A. In FIG. 3 nozzles 36 are positioned in proximity of the hardware positions for the hardware components. The nozzles can be positioned in the direct proximity or substantially against the hardware component. The nozzle 36 can be configured to supply cooling liquid directed at a hardware component 37 at a predetermined location of the hardware component. The nozzle can be configured in an individual manner with respect to the hardware component, such that the specific heating profile of the hardware component 37 can be taken into account.

Other nozzles connected to the cooling liquid supply 34A can also be present in the reservoir 32A, for more general flow of cooling liquid through the reservoir.

If the amount of cooling liquid surpasses a particular level 38A, used cooling liquid can be recovered from the reservoir 32A. In other instances, cooling liquid can be recovered over time such that the amount of cooling liquid in the reservoir 32A does not surpass the particular amount. In the present embodiment an overflow weir 38B is used to extract used cooling liquid from the reservoir 32A.

Overflow weir 38B is formed by the top part of a standing wall part that separates the righthand side reservoir with immersed hardware components 37 from the left-hand side overflow reservoir 32B that the cooling liquid recovery parts. The partition wall with weir will prevent that the recovery pumps empty out the reservoir part holding the cooling liquid with immersed hardware components.

The overflow weir can be positioned along an entire side face of the reservoir 32A. The overflow weir can also surround the reservoir. There can also be two overflow weirs for draining used cooling liquid from the reservoir once the cooling liquid in the reservoir reaches a certain amount, such that the reservoir is surrounded, at least on two sides, by the at least two overflow weirs.

A setup with two overflow weirs, or in general a setup where cooling liquid is extracted from two or more sides, is beneficial since it allows for a better extraction of the used cooling liquid. In this way, the overflow reservoir 32B is less burdened by the extraction of used cooling liquid and the flow becomes more uniform and/or calmer. Since a calmer flow of the cooling liquid is thus made, it is possible to use a higher flow rate through the reservoir 32A without causing any issues relating to flow of the cooling liquid. This is especially beneficial for larger hardware components, or hardware components that produce more heat and need to be cooled more.

The overflow reservoir 32B can comprise an overflow liquid sensor 35D configured to measure the amount of liquid in the overflow reservoir. One or more pumps 39A can be positioned in the overflow reservoir 32B and configured to pump out used cooling liquid from the overflow reservoir 32B. The pumps can be regulated based on the measurements of the overflow liquid sensor 35D. Furthermore, the output of the overflow liquid sensor 35D can be used to regulate the amount of cooling liquid flowing through the inlet and/or the outlet.

Multiple overflow liquid sensors 35D can be used. One can be positioned at a height near the top of overflow weir 38B. This sensor will sense liquid when the level of liquid in the overflow reservoir 32B rises too high. Another overflow liquid sensor can be positioned near the bottom of the overflow reservoir 32B. If the lower liquid sensor stops sensing liquid, this can an alarm indicating that the liquid level dropping and that the system could run dry. In embodiments the one or more overflow liquid sensors are connected to the programmable logic controller 31.

The one or more pumps 39A present in the overflow reservoir 32B pump the used cooling liquid out of the overflow reservoir 32B. Preferably, the pumps pressurize the outlet 34B and the inlet 34A such that the pumps determine the amount of pressure in the outlet 34B and the inlet 34A. The pumps thus can also at least partly determine the pressure in the injection structures 36 and the flow through speed in the reservoir 32A. The one or more pumps can be connected to a frequency controller 39B.

Frequency controller 39B is arranged to increase or decrease the pump rate of the one more pumps in the system. The frequency controller 39B and as a result the pumps, are controlled by a processor, such as a programmable logic controller 31. When the pressure in liquid supply 34A measured by pressure sensor 35B drops, the frequency controller will increase the pump rate. When downstream liquid parts 48, also supply arms, are decoupled from the manifold 47, the PLC will instruct the frequency controller to reduce the pump rate.

In embodiments, methods and systems are provided wherein the supplied amount of cooling liquid to the manifold 47 is dependent on the sensed pressure in the liquid supply line. The manifold 47 has connection points or manifold outlets for one or more downstream liquid supply parts that have one or more nozzles. The connection points of manifold outlets are pre-formed in the manifold and can be opened and closed. The positions of the connection points or manifold outlets is outside of the liquid in the liquid reservoir. The positions of the outlets align with respective possible positions of the hardware in the immersion system. The manifold extends along the hardware positions.

The connection points or manifold outlets are closed, when no hardware is present at the respective position. When hardware is positioned at the connection point position, a suitable and individual adjusted nozzle carrying part or liquid supply part is configured. The one, two, three or more nozzles are preferably configured with the nozzles directed at the hardware position and in accordance with a heat profile of the respective hardware. Preferably the to-be-connected nozzle carrying part or liquid supply part is a L-shaped channel with at least a nozzle on the vertical and at least a nozzle on the horizontal part.

As different nozzles and different downstream liquid supply parts 48 can be coupled with the manifold, dependent on the hardware or hotspots of the hardware to be cooled, the desired supply amount can vary and can be unknown. By measuring the pressure, and controlling the liquid supply dependent on said pressure, the liquid supply can be controlled. In an embodiment the measured pressure is compared to a set point pressure and the pump rate is adjusted to bring the measured pressure closer to the set point pressure.

The pumps pump out the used cooling liquid into the outlet 34B. The outlet 34B can comprise a temperature sensor 35E for measuring the temperature of the cooling liquid in the outlet 34B.

In FIG. 3, cooling liquid recovered from reservoir 32A flows through tube 34B to the heat exchanger 33C. Here the temperature of the recovered cooling liquid can be controlled, e.g. cooled to a desired temperature. The cooling liquid with desired temperature flows via tube 34A to the cooling liquid supply to be fed to the reservoir 32A again.

Furthermore, extra cooling liquid can also be put through the heat exchange element 33C so as to arrange the temperature of the new cooling liquid. The heat exchange element 33C can be coupled to a cooling line which thus cools the cooling liquid flow into and/or out from the immersion cooling system 10.

Heat exchanger 33C can also have inlet 34C and outlet 34D. Inlet 34C and outlet 34D carry a second cooling medium that has the desired temperature. The cooling line with cooling line inlet 34C and cooling line outlet 34D can comprise a secondary cooling liquid such as water or glycol or a combination, or any other cooling liquid which has a suitable heat capacity that flows through the heat exchange element 33C and extracts heat from the used cooling liquid, such that it can directly be used again. For example, the cooling liquid and the secondary cooling liquid are the same. In an embodiment, the cooling liquid and the secondary cooling liquid are the same and are mixed in the heat exchange element 33C.

A valve 33A controls the amount of secondary cooling liquid that flows through the cooling line inlet 34C towards the heat exchange element 33C. The valve 33A can be configured to automatically regulate the amount of cooling liquid that flows into the heat exchange element on the basis of one or more process parameters. The one or more process parameters can comprise for example the temperature of the cooling liquid for the cooling line inlet 34C, the temperature of the used cooling liquid from the cooling line outlet 34D, the volumetric flow rate of the liquid flowing through the inlet 34A and/or the opening of the valve. For example, the valve can be configured to keep the temperature of the cooling liquid in the reservoir 32A constant or the fluid pressure in the inlet constant.

Different sensors 33B can be connected to the valve 33A to enable the automatic regulation of the amount of cooling liquid that flows into the heat exchange element. The sensors 33B can comprise a temperature sensor measuring the temperature of the cooling liquid in the inlet 34A, a temperature sensor measuring the temperature of the cooling liquid in the outlet 34B and/or a sensor measuring the volumetric flow rate in the inlet 34A. Based for example on these sensor measurements, the valve can be opened or closed.

The valve 33A can also be controlled based on further process parameters from the inlet 34A and outlet 34B, the reservoir, the hardware components, et cetera.

The immersion cooling system 30 can comprise a programmable logic controller 31. The programmable logic controller can be connected to a user interface for input and output of various control settings. The valve 33A can be connected to the programmable logic controller 31 in order to regulate the amount of heat extracted via the heat extraction element from the used cooling liquid that has flown through the reservoir 32A.

Any or all of the disclosed sensors, drives, controllers, valves of the system can be connected to the PLC 31. The programmable logic controller can make use of various sensors, for example sensor readouts from the sensors 33B or in the valve 33A, but also for example a volumetric flow rate sensor 35A, a pressure sensor 35B and/or a temperature sensor 35C placed in the inlet 34A, the overflow sensor 35D, and/or the temperature sensor 35E placed in the outlet 35E. Predetermined values for the different process parameters can be reached and maintained based on these sensor measurements, and the programmable logic controller 31 can be connected to the one or more pumps 39A and/or the valve 33A in order to control these components. The programmable logic controller 31 adapts its settings if the temperatures are not equal to the predetermined values that are wanted. For example, these can be temperatures of the hardware components 37, either globally or locally. If the temperature of the hardware components changes, the settings of the programmable logic controller 31 can be adapted to counter these changes. This can also be done based on the temperature readouts of sensors present in the inlet 34A, outlet 34B, cooling line outlet 34D or similarly placed temperature sensors.

The programmable logic controller 31 can adapt the system settings such that the pressure in the pressure line formed by at least the inlet 34A remains constant. In this way, the throughflow and working of the nozzles is guaranteed.

Furthermore, the programmable logic controller 31 can adapt the throughflow of the cooling liquid when the temperature of the hardware components 37 change. In this way, the ideal working temperature can be set and maintained.

Figure 4A:
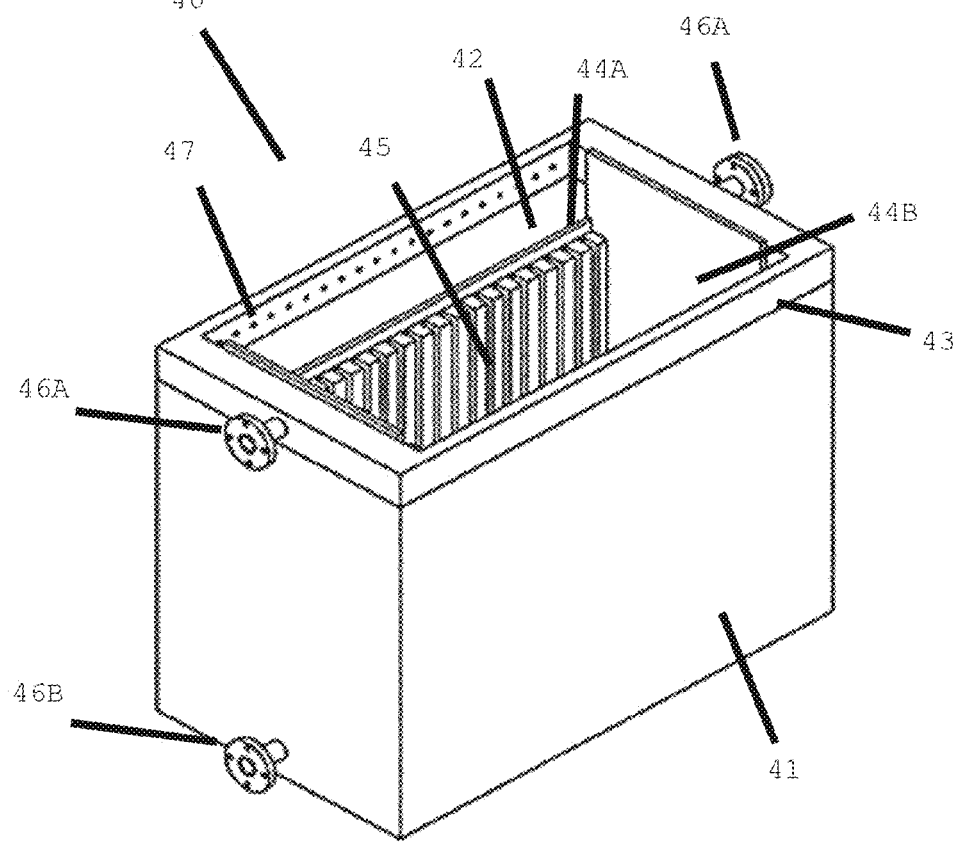
FIGS. 4A-C schematically illustrate a perspective view, a sectional view across a long edge, and a sectional view across a short edge of a reservoir of an exemplary immersion cooling system according to the present invention.

FIG. 4A schematically illustrates a perspective view of a reservoir 40 of an exemplary immersion cooling system according to the present invention. The reservoir 40 has four sides 41 which define the space in the reservoir 40 which can be filled with the cooling liquid. The cooling liquid in this embodiment reaches up to the upper edge of an overflow weir 44A which defines an overflow reservoir 42 (formed between the standing wall under weir 44a and one of the four sides of the reservoir), which essentially acts as a gutter for the used cooling liquid.

The overflow reservoir 42 is separated from the reservoir by a partition wall 44B which in this embodiment reaches to a higher height than the overflow weir 44A, but which can also be configured such as to reach up to the same height as the overflow weir 44A, such that the overflow weir 44A surrounds the reservoir from all sides.

Within the reservoir a wall member 45 is formed with recesses or grooves extending in the vertical direction. In these grooves the hardware components can be placed. Furthermore, the recesses can be used to harbour the injection structures as will be shown below.

A manifold 43 is part of the cooling liquid supply. The cooling liquid flows into the manifold 43 via the inlet connection points 46A, via which the manifold 43 is for example coupled to a heat exchange element and other elements of the immersion cooling system through which cooling liquid is supplied to the reservoir. The manifold 43 can also be coupled to other reservoirs using the connection points 46A. The manifold 43 has two inlet connection points 46A in the embodiment, however in general the inlet 43 can have one or more inlet connection points 46A. Connection points 46A can be sealed or closed or can have a close-off valve. Two inlet connection points 46A allow providing pressured cooling liquid to two ends of the manifold 43. This allows providing a more stable pressure in the manifold, which in the end results in a more stable pressure at the nozzles. In an embodiment a third or more inlet connection point 46A is provided, e.g. in the middle of the manifold 43.

One or more outlet connection points 46B can be present for coupling the overflow reservoir 42 to other elements of an immersion cooling system. In the case an overflow reservoir 42 is not present, but another method is present in the reservoir to recover the used cooling liquid, the one or more outlet connection points 46B can be coupled to these other methods. The outlet connection points 46B can be coupled to a heat exchange element for example, such that cooling liquid from the outlet connection point 46B can be cooled again, and be supplied towards the one or more inlet connection points 46A.

The manifold 43 forms a pressure duct around the reservoir 40. The manifold 43 can also only partly surround the reservoir 40. Along the inlet 43, one or multiple connection points 47 can be formed. A connection point 47 is configured for connecting an downstream supply part thereto. The number of connection points can be chosen based on the number of hardware positions and/or the number of hardware components that can be immersed in the reservoir. For example, the number of connection points can be equal to or twice the maximal number of hardware components that can be immersed in the reservoir. Usually the hardware components used in datacenters have standardized sizes. One or more coupling points can be assigned to a particular hardware component, for example two, four, six, eight.

A connection point belonging to a certain hardware position can be closed off when the hardware component is not (yet) present. In this way, cooling liquid is only supplied at the hardware components that are present in the reservoir. A click coupler can form the connection point. This allows easy coupling and decoupling of the supply arm/downstream supply part 48. The downstream supply part can have an upstream end that mates with the click coupler.

The connection points can be positioned on at least two sides of the reservoir, preferably on opposing sides of the reservoir. In this way, cooling liquid can be supplied from at least two sides towards the hardware components.

In embodiments multiple cooling liquid supplies operating with cooling liquid at different temperatures can be used in a single reservoir, e.g. in the event that different hardware components have different requirements in terms of working temperatures. In this case, cooling liquid supplied by the nozzles coupled to different cooling liquid supplies can have different respective temperatures tailored to the specific needs of a hardware component. For example, multiple heat exchange elements can be used in order to obtain the cooling liquids at different temperatures. The cooling liquids are supplied to the same reservoir and can be extracted using a joint outlet.

Figure 4B:
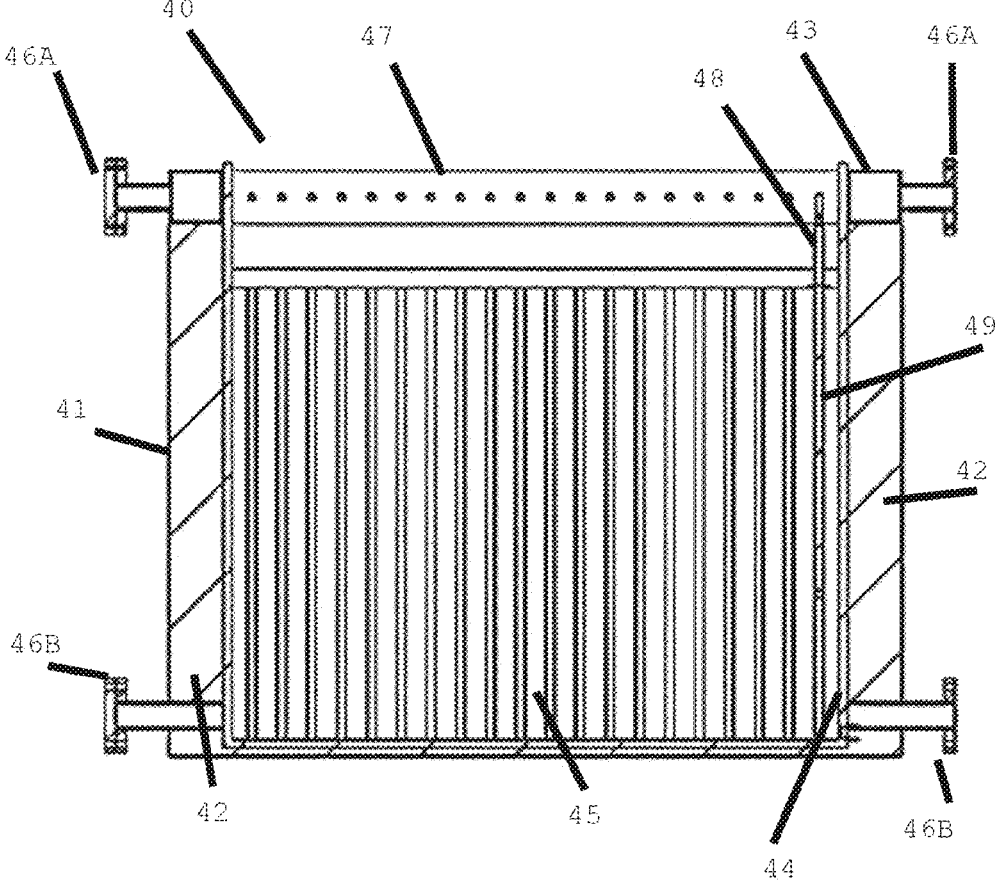

FIG. 4B schematically illustrates a sectional view across a long side of a reservoir 40 of an exemplary immersion cooling system according to the present invention.

A downstream supply part 48 is connected to a connection point 47. The downstream supply part 48 with one or more nozzles (not visible in FIG. 4B) is positioned in the proximity or substantially against a hardware component 49 present in the reservoir. The one or more nozzles are arranged to supply cooling liquid directed at the hardware component held in the hardware position. In embodiments the direction and/or other properties of the nozzle are determined by the heat profile of the hardware component in use. The heat profile provides predetermined location that e.g. form a hot spot and at which more cooling liquid should be directed. In this way, the hardware component can be cooled locally and according to the heating profile of the hardware component 49.

The hardware component 49 can be removable attached to the wall 45 of the reservoir which has recesses. In embodiments the hardware component 49 is received in a rack that is received in the recess. Furthermore, the downstream supply part 48 can also be formed and positioned such as to be placed in one of the recesses of the wall 45. In this way, the side of the hardware component can be appropriately cooled and less space in the reservoir is used by the downstream supply part such that the design can be more compact.

Figure 4C:
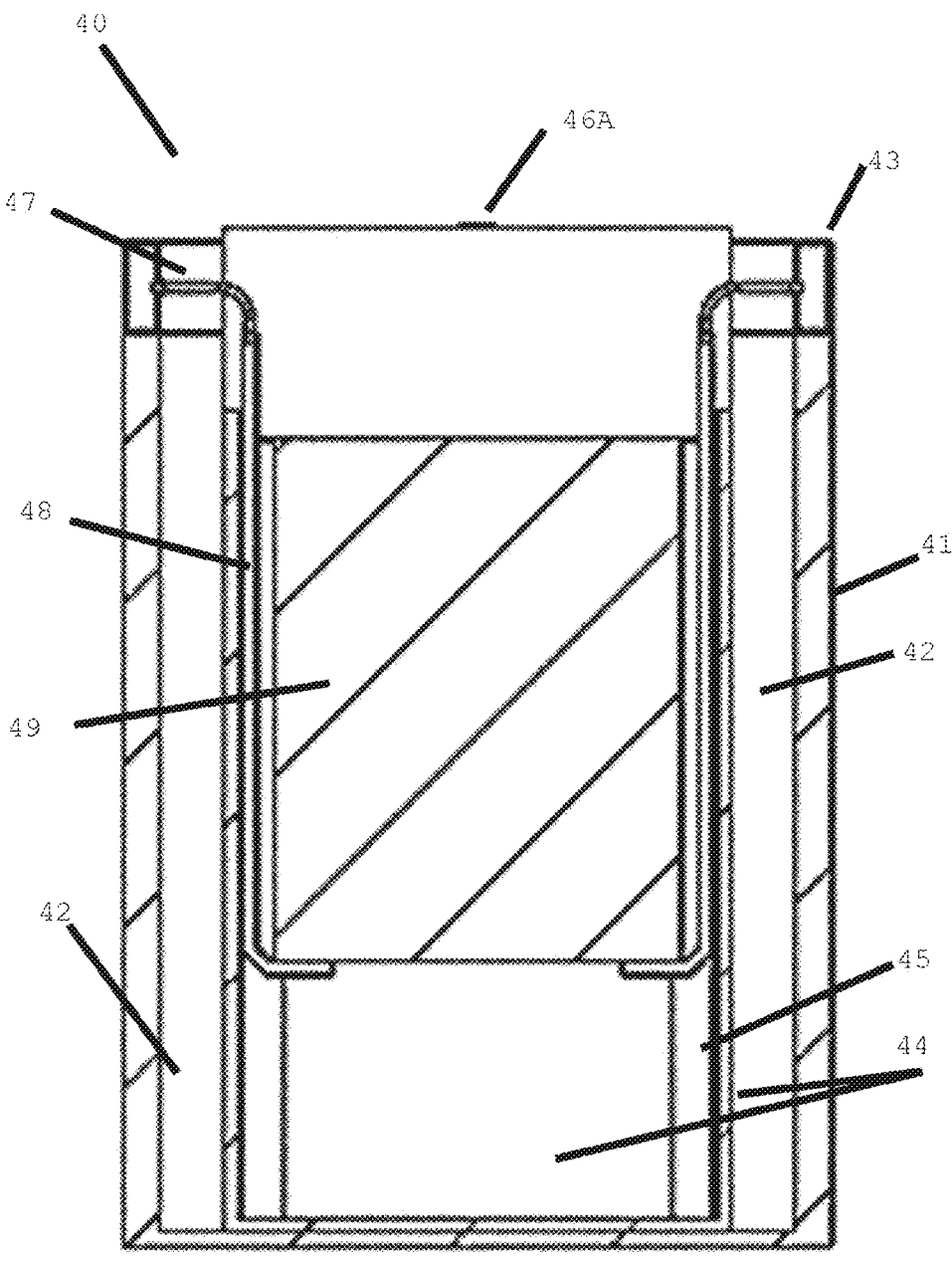

FIG. 4C schematically illustrates a sectional view across a short side of a reservoir of an exemplary immersion cooling system according to the present invention. The hardware component 49 can be cooled using two downstream supply parts 48. The downstream supply parts can be formed and configured to supply cooling liquid directed at the hardware component from two side faces of the hardware component 49 and/or below the hardware component. Nozzles are formed on the downstream supply part with which cooling liquid is supplied.

The downstream supply part 48 has a vertical part extending along a vertical part of the hardware component and has a horizontal tip part extending along the bottom of the hardware component. The length of the vertical part is set to correspond with the length/depth of the hardware component to make sure that the horizontal part is positioned at close proximity to the bottom of the hardware component.

Also visible in FIG. 4C is a flexible tubing part that connects the manifold 43 to the vertical part of the downstream supply part.

A releasable seal can be present in the reservoir 40 and configured to enable the reservoir 40 to be drained. The seal closes-off the reservoir during use.

Figure 5:
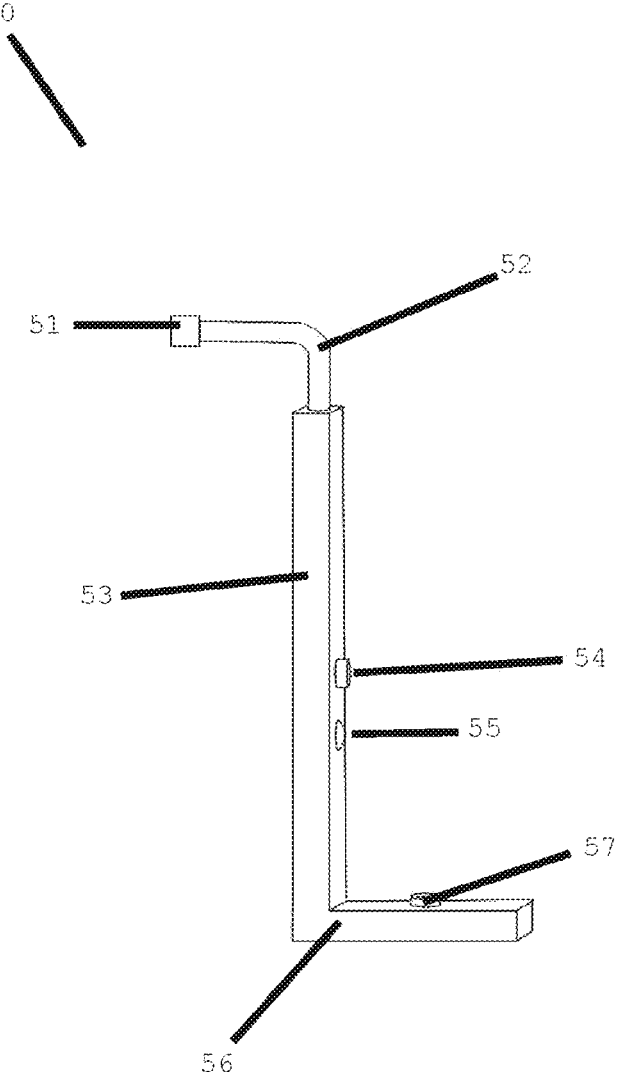
FIG. 5 schematically illustrates an injection structure of an exemplary immersion cooling system according to the present invention.

FIG. 5 schematically illustrates the downstream supply part 50 of an exemplary immersion cooling system according to the present invention.

A coupling element 51 can connect the downstream supply part 50 to a connection point formed on the manifold of the immersion cooling system. A duct 52 connects the coupling element 51 to a vertical part 53. The duct 52 can be formed from a flexible material such that placement against the hardware component becomes easier, and different configurations in geometry of the hardware component, for example distance to the side wall of the reservoir, can be accounted for.

The vertical part 53 comprises a coupling to the duct 52 and is configured with a hollow rectangular profile in this embodiment, although other shapes can be used. In a side wall of the vertical part 53 facing the hardware component during use, a nozzle 54 can be placed which is configured to cool the hardware component in a specific manner, adapted to the heating profile of the hardware component. A nozzle 54 formed in the vertical element can provide an inflow of cooling liquid to a side of the hardware component.

The nozzle 54 can be adapted based on the specific requirements of the hardware component it is cooling. For example, the location of the nozzle along the element can be changed, the angle of supply can be changed by changing the angle at which the output of the nozzle is placed, the diameter of the output can be changed, the type of spray the output creates can be changed. In this way it is possible for the immersion cooling system to cool every hardware component individually and as efficient as possible by utilizing the cooling capacity in the most optimal form possible.

A removable seal 55 can be placed in the case that a nozzle is not required at a particular point on the vertical part 53. The seal 55 can be removed and a nozzle can be placed if required by the for example the heating profile of the specific hardware component related to the injection structure 50.

The vertical part 53 continues into a horizontal part 56. The length of the vertical part 53 preferably matches the side of the hardware component in such a way that the horizontal part 56 faces the bottom side of the hardware component and is placed directly against the hardware component.

In embodiments the vertical part 53 can be extended, e.g. telescopically, to give it the length corresponding with the height of the hardware component. In other embodiments, multiple downstream supply parts are available and the desired one is picked dependent on the size of the hardware component.

The horizontal part 56 is configured with a hollow rectangular profile in this embodiment, although other shapes can be used. A similar nozzle 57 as was used for the vertical element 53 can be used for the horizontal element 56 as well. The horizontal element 56 can be on one end connected to the vertical part, but on the other end closed off. The length of the horizontal element depends on the specific requirements of the hardware component.

A downstream supply part 50 with just a horizontal part or a vertical part is also possible. The horizontal and/or vertical part can branch off and form other horizontal and/or vertical parts. The one or more downstream supply part can in this way at least partly surround the hardware component. Two downstream supply part can be connected to one another.

Using these downstream supply parts 50, the flow of the cooling liquid supplied by the first downstream supply part can be such that the flow substantially follows at least part of the geometrical shape of the hardware component. Furthermore, the flow of the cooling liquid supplied by the downstream supply part 50 can be tailored to the heating profile of the hardware component. Furthermore, the downstream supply part 50 in this way supplies cooling liquid to the hardware component individually.

Figure 6A:
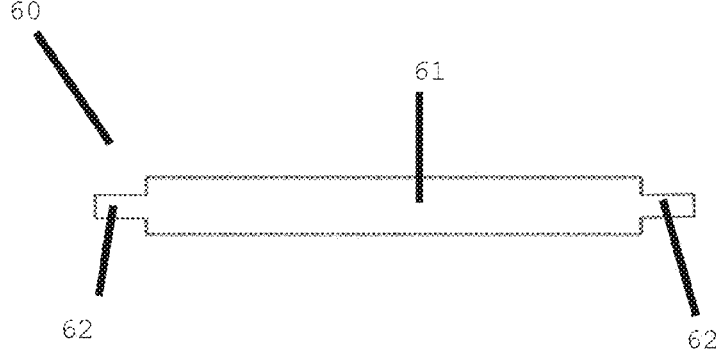
FIGS. 6A-B schematically illustrate a top and front view respectively of a filler body according to the present invention.
Figure 6B:
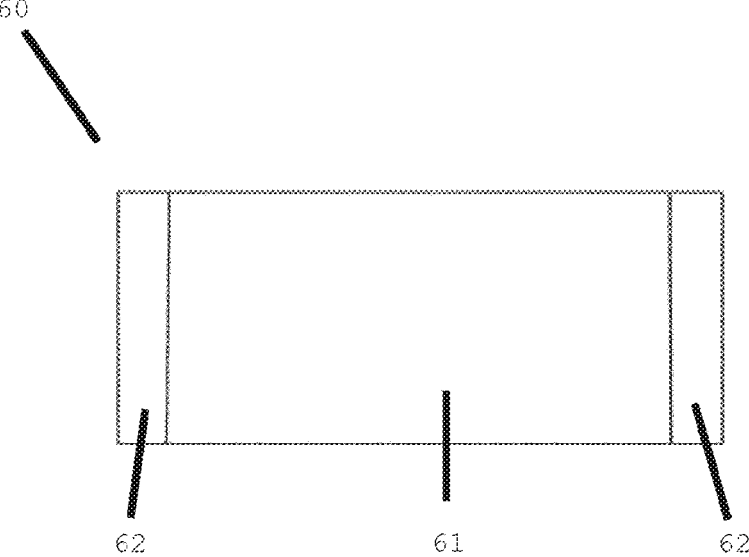

FIG. 6A-B schematically illustrate a top and front view respectively of a filler body according to the present invention.

Reservoirs can have standard sizes and the hardware components vary in size often unused space is unnecessarily filled with cooling liquid which influences the temperature and flow of the cooling liquid in the reservoir. Providing entirely custom reservoirs that are built to the exact shape of each of the hardware components is expensive and does not provide for a versatile system that can be adapted to different hardware components being placed or removed from the reservoir. Sometimes a particular hardware component is not present in the reservoir. It can also occur that a particular hardware component does not reach to the bottom of the reservoir. The space between the bottom of the hardware component and the bottom of the reservoir is then unnecessarily filled with cooling liquid. This cooling liquid can have an adverse effect on the cooling of the hardware components present in the reservoir.

A filler body 60 can be placed in the space between the bottom side of the hardware component and the bottom of the reservoir to fill up the space between the hardware component and the bottom of the reservoir. Also, if a hardware component is not present at a hardware position in the reservoir, the entire space of the hardware position can also be filled up by a filler body 60.

The filler body 60 can comprise for example polypropylene which is resistant to the cooling liquid and the temperature of the cooling liquid in the reservoir, preferably 70 degrees Celsius or more. The main body 61 of the filler body 60 can be hollow.

The filler body 60 can comprise for example a tongue 62 of a tongue-and-groove joint so as to be removably fixed to the reservoir with such a joint. For example, the recess in the wall for placement of the injection structure and/or the hardware component can also hold the filler body. The groove of the tongue-and-groove joint is thus formed in a side wall of the reservoir. Other ways of removably attaching the filler body to the reservoir are also possible, e.g. via friction, by using materials that sink, et cetera.

The filler body 60 fills or substantially fills the space between the bottom side of the hardware component and the bottom of the reservoir. The filler body 60 can be positioned below the injection structure, below the hardware component, or anywhere in the reservoir where no hardware components or other structures are present.

If a reservoir is configured to hold multiple hardware components, the space between the bottom side of each of the multiple hardware components and the bottom of the reservoir can be filled with a particular filler body 60 having a particular geometry for that respective space, preferably wherein each of the filler body 60 fills or substantially fills the space between the bottom side of each of the hardware components and the bottom of the reservoir.

In a 19-inch rack, which is a standardized frame for mounting multiple hardware components, for a rack unit a space of 25 centimetre can be filled using the filler body, which results in a cooling fluid saving of about 4 litres.

Figure 7:
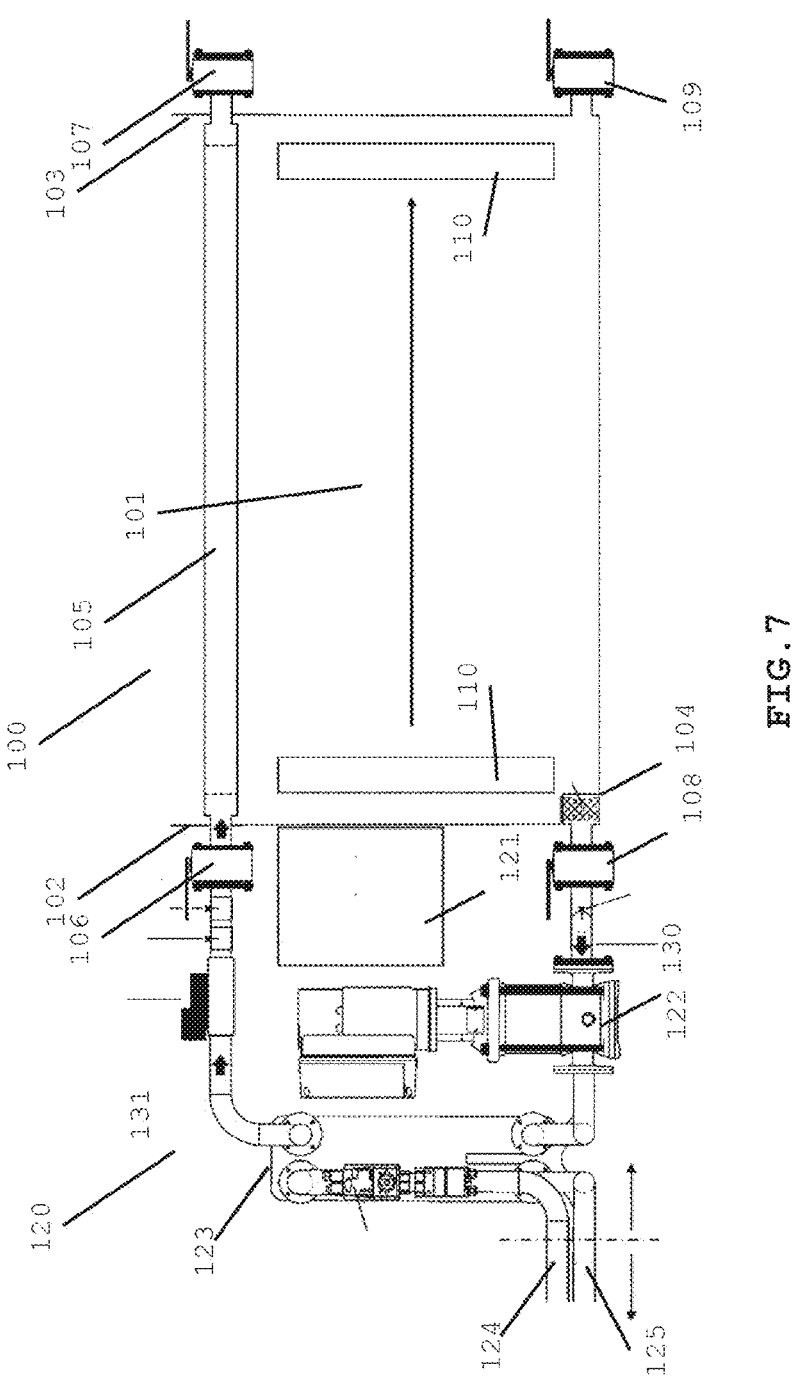
FIG. 7 shows a partially open side view of a system according to the invention.

FIG. 7 shows a immersion cooling system 100. A reservoir 101 is filled with cooling liquid. The reservoir is limited by end walls 102 and 103. In between end walls 102-103 a pressure loop or manifold 105 has at least 25 connection points to connect downstream hardware-specific supply parts with nozzle thereto. Similarly the housing of the reservoir 101 has 25 positions at which hardware, such as the illustrated two hardware components 110, can be positioned. The positions of hardware 110 are generally vertical.

Manifold 105 has an inlet coupling 106 and an outlet coupling 107. Coupling 106 receives cooled immersion fluid from the upstream feeding system 120. The cooling fluid is fed via the manifold to the downstream supply parts (not shown) that have nozzles directed at each of the hardware components 110. Outlet coupling 107 can be coupled to an inlet coupling of a further manifold of a further reservoir with additional positions for hardware to be cooled.

Near a bottom of the reservoir 101 a pre-filter 104 is positioned between reservoir and outlet 108. An inlet 109 can receive cooling liquid from a further coupled reservoir.

In this embodiment the feeding system 120 comprises controller 121, a pump 122 and a heat exchanger 123. Heat exchanger 123 is coupled with a further cooling liquid supply 124 and outlet 125. A secondary cooling liquid can be provided from an external source via inlet 124 to heat exchanger 123. Cooling liquid from the reservoir 101 can flow via outlet 108 according to arrow 130 pumped by pump 122 into heat exchanger 123 in order to bring that cooling liquid 130 at a desired temperature. The cooling liquid can flow according to arrow 131 from heat exchanger 123 to the inlet 106 of manifold 105 into reservoir 101 for cooling hardware.

Figure 8:
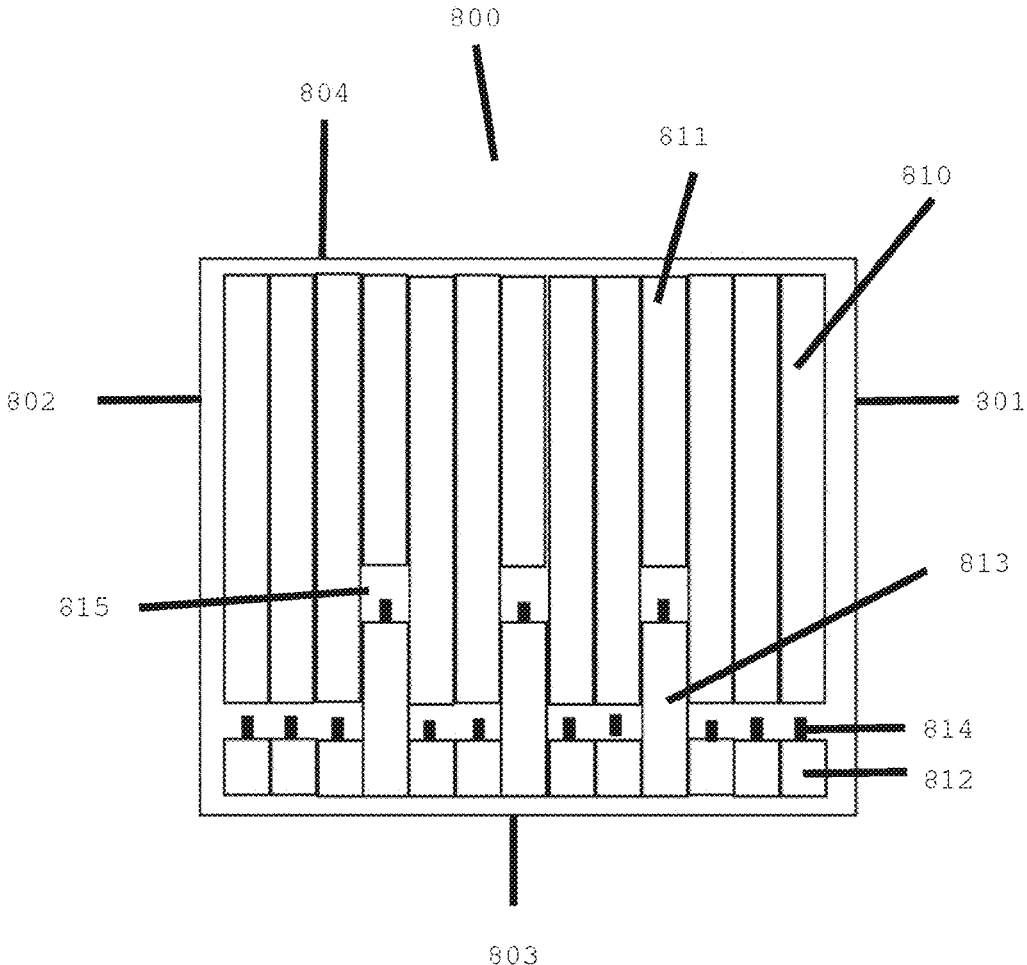
FIG. 8 shows a schematical cross-section of a immersion system with filler bodies.

FIG. 8 shows the interior of a liquid reservoir 800 of which the side walls 801, 802 and bottom wall 803 are shown. The liquid reservoir 800 is filled with liquid 804. Several hardware components 810, 811 are mounted in the rack and suspended in the liquid for cooling. Cooling liquid can be supplied via nozzle carrying parts that extend downward from a manifold along the hardware component and reach under hardware component. The bottom part nozzles 814, 815 are shown in FIG. 8.

Components 810 are longer than components 811. All components are completely suspended in the cooling liquid. The top sides of the components 810 and 811 are generally aligned. As a result of the different lengths, the bottom ends of the components 810 reach deeper into the liquid than the bottom ends of components 811. The bottom part nozzles 814, 815 and respective nozzle carrying parts are configured to reach under the respective bottom sides.

The nozzle carrying parts are connected via an inlet of the channel to the manifold that extends along the positions of the hardware components. The nozzle carrying parts 814 configured for the components 810 will have a longer vertical parts than the nozzle carrying parts 815 configured for the component 811.

Filler bodies 812 and 813 are dimensioned differently. The filler bodies are dimensioned to correspond with a part of the remaining distance between the bottom side of the components and the bottom of the liquid reservoir. The filler bodies are arranged to fill the remaining distance for about at least 70%, preferably at least 80%. A small distance remains allowing the nozzle carrying part with nozzles to reach underneath the bottom sides of the respective hardware components 810, 811.

Figure 9:
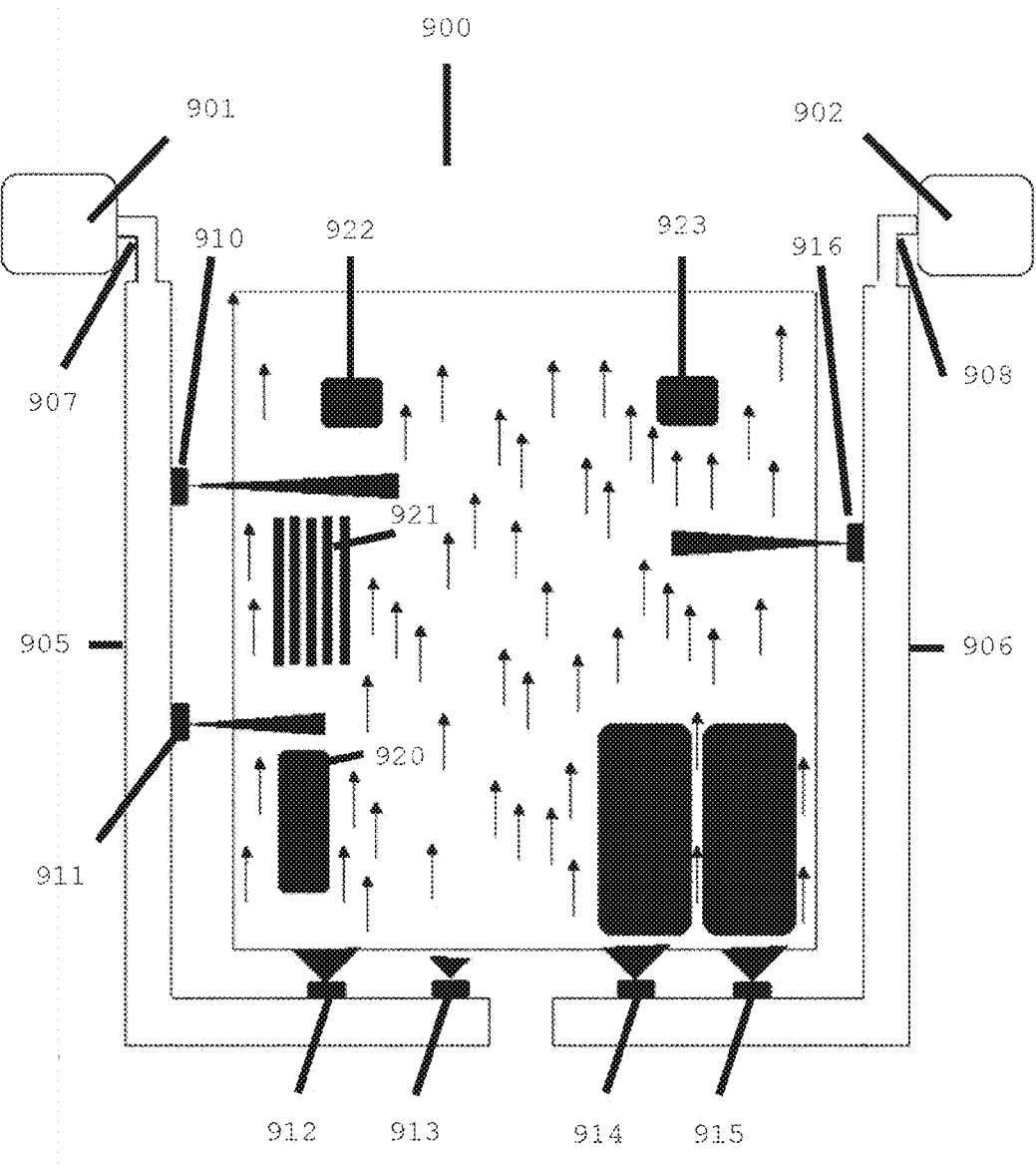
FIG. 9 shows schematically the cooling of heat sources in a liquid immersion system of the invention.

FIG. 9 shows a schematical view of the immersion system 900 in a configured state. Manifolds 901 and 902 extends along the positions of the hardware components in the liquid immersion system. Two nozzle carrying parts 905 and 906 are connected to the manifolds 901 and 902. Inlets 907, 908 of the two nozzle carrying parts 905, 906 connect the manifold to the channel formed in the parts 905, 906. The channels allow supplying the liquid from the manifold to the respective nozzles 910-916.

Hardware components have six heat sources 920-925, which are shown schematically. Nozzles 914, 915 are provided on a horizontal part of the nozzle carrying part 906 and are directed at the heat sources 924, 925. Cooled liquid is directed at the heat sources and will warm up by transferring heat from the heat source to the liquid. The heated liquid will flow upwards. Nozzle 916 is provided on the vertical part of nozzle carrying part 906 and is directed at the heated liquid flow for cooling. The cooled liquid will continue to flow upward and contact heat source 923 for cooling.

Nozzle 912 is provided on a horizontal part of the nozzle carrying part 905 and is directed at the heat source 920. Cooled liquid is directed at the heat source 920 and will warm up by transferring heat from the heat source to the liquid. Nozzle 913 is configured with a small nozzle spray pattern. As it is not directed at a heat source, a relatively reduced amount of liquid is supplied via nozzle 913 to the liquid reservoir. Heated liquid from heat source 912 will flow upwards. Nozzle 911 is provided on the vertical part of nozzle carrying part 905 and is directed at the heated liquid flow for cooling. The cooled liquid will continue to flow upward and contact heat source 921 for cooling. Nozzle 910 is provided on the vertical part of nozzle carrying part 905 and is directed at the heated liquid flow for cooling. The cooled liquid will continue to flow upward and contact heat source 922 for cooling. FIG. 9 also shows that the horizontal directed nozzles have a narrow spray pattern to allow a concentrated spray injection that allows the cooled liquid to be supplied at a relatively large distance from the vertical part.

Example nozzles that can be used in combination with this invention are:

Flat (even) nozzles
   Provide even distribution of medium-sized flow throughout the thin rectangular spray pattern;
   when use on a header, nozzles are positioned from edge to edge pattern contact;
   spray angle of 25-26 degrees:

full cone nozzles
   use an internal vane design to produce a solid cone-shaped spray pattern;
   spray pattern consist of medium- to large flow;
   spray angle range 15 to 125 degrees solid stream nozzles
   produces a solid stream spray with high impact per unit area
   little spread
   spray angle is less than 10 degrees Two or more of the above embodiments may be combined in any appropriate manner.

The below clauses disclose the invention:

Clause 1. Immersion cooling system for controlling the temperature of a heat generating hardware component, the immersion cooling system comprising:
   a reservoir for holding a cooling liquid in which the hardware component can be immersed;
   a cooling liquid supply for supplying cooling liquid into the reservoir comprising one or more nozzles; and
   a cooling liquid recovery for recovering cooling liquid from the reservoir comprising an outlet;
   wherein the reservoir has multiple hardware positions to receive multiple hardware components, the hardware positions being positioned in a flow path of the cooling liquid from the one or more supply points to the outlet,
   wherein the cooling liquid supply having one or more nozzles for each multiple hardware positions, the one or more nozzles configured to supply cooling liquid directed at the hardware position of the hardware component.

Clause 2. The immersion cooling system of any one of the preceding clauses, further comprising a filler body to be placed in a space between a bottom side of the immersed hardware component and a bottom of the reservoir, wherein preferably a height of the filler body correlates with a distance between the bottom side of the hardware component and the bottom of the reservoir, wherein the filler body fills that distance for the most part.

Clause 3. The immersion cooling system of clause 2, wherein the filler body comprises polypropylene which is resistant to the cooling liquid and the temperature of the cooling liquid in the reservoir, preferably 70 degrees Celsius or more.

Clause 4. The immersion cooling system according to clause 2 or 3, wherein one or more nozzles of the cooling liquid supply filler body are positioned between the filler body and the hardware component.

Clause 5. The immersion cooling system according to any of the clauses 2-4, wherein the reservoir and filler body have a tongue-and-groove joint for positioning the filler body.

Clause 6. The immersion cooling system according to any of the clauses 1-5, combined with any of the features disclosed herein, in particular any of the features disclosed in the claims.

Clause 22. A method for cooling a hardware component, the method comprising:

providing a reservoir for holding a cooling liquid supplying cooling liquid into the reservoir;

immersing one or more hardware components in the cooling liquid;

recovering cooling liquid from the reservoir; and characterized by:

positioning a filler body in the reservoir between a bottom of the hardware component and a bottom of the reservoir.

Clause 23. Method according to clause 22, comprising any of the other method steps disclosed herein.

Clause 24. Immersion cooling system for controlling the temperature of a heat generating hardware component, the immersion cooling system comprising:

a reservoir for holding a cooling liquid in which the hardware component can be immersed;

a cooling liquid supply for supplying cooling liquid into the reservoir comprising one or more nozzles; and a cooling liquid recovery for recovering cooling liquid from the reservoir comprising an outlet;

wherein the reservoir has multiple hardware positions to receive multiple hardware components, the hardware positions being positioned in a flow path of the cooling liquid from the one or more supply points to the outlet, the immersion cooling system characterized by:

the immersion cooling system further comprising a filler body to be placed in or under a hardware position Clause 25. Immersion cooling system according to clauses 24, wherein the filler body fills a space between a bottom side of the immersed hardware component and a bottom of the reservoir, wherein preferably a height of the filler body correlates with a distance between the bottom side of the hardware component and the bottom of the reservoir, wherein the filler body fills that distance for the most part.

Clause 26. Immersion cooling system according to clauses 24 or 25, having any of the features of the disclosed immersion cooling system.

Clause 27. A method for cooling immersed hardware components, the method comprising:

providing a reservoir for holding a cooling liquid supplying cooling liquid in the reservoir;

immersing one or more hardware components in the cooling liquid: characterized by providing heat profiles of one or more hardware components in use;

configuring of the supply of cooling liquid directed at a first hardware component dependent on the first heat profile and configuring the supply of cooling liquid directed at a second hardware component dependent on the second heat profile, different from the first heat profile.

Clause 28. Method according to clause 27, comprising any of the other method steps disclosed herein.

Clause 29. Immersion cooling system for controlling the temperature of a heat generating hardware component, the immersion cooling system comprising:

a reservoir for holding a cooling liquid in which the hardware component can be immersed;

a cooling liquid supply for supplying cooling liquid; and a cooling liquid recovery for recovering cooling liquid from the reservoir comprising an outlet;

wherein the reservoir has multiple hardware positions to receive multiple hardware components, the immersion cooling system characterized by:

the cooling liquid supply comprising a manifold with multiple connection ports, having at least one port at each hardware position.

Clause 30. Immersion cooling system according to clause 29, wherein the cooling liquid supply comprises a downstream supply part having one or more nozzles arranged to be connected to the connection point of the manifold, the one or more nozzles configured to supply cooling liquid directed at the hardware position of the hardware component.

Clause 31. Immersion cooling system according to clause 29 or 30, in combination with any of the claims 1-14 and/or further comprising any of the features disclosed herein.

The invention claimed is:

1. An immersion cooling system for controlling the temperature of a heat generating hardware component, the immersion cooling system comprising:

a reservoir configured to hold a cooling liquid in which the hardware component is to be immersed;

a cooling liquid supply connected to supply cooling liquid into the reservoir, the cooling liquid supply comprising one or more nozzles; and a cooling liquid recovery connected to recover cooling liquid from the reservoir, the cooling liquid recovery comprising an outlet, wherein the reservoir has multiple hardware positions to receive multiple hardware components, the hardware positions being positioned in a flow path of the cooling liquid from the one or more cooling liquid supply points to the outlet, the immersion cooling system characterized by:

the one or more nozzles being for each of the multiple hardware positions and being configured to supply cooling liquid directed at the hardware positions of the hardware components, wherein the cooling liquid supply comprises a manifold extending along the multiple hardware positions, wherein the manifold is arranged to be coupled with nozzle carrying parts, wherein each of the nozzle carrying parts has a channel with an inlet that is connectable to the outlet of the manifold and wherein the nozzle carrying part has at least one nozzle connected to the channel, wherein the nozzle carrying part is L-shaped, having a L-shaped channel, wherein the inlet of the channel of the L-shaped nozzle carrying part is formed in one part of the L-shaped nozzle carrying part and a nozzle is connected to the channel on the other part of the L-shaped nozzle carrying part.

2. The immersion cooling system of claim 1, wherein a first nozzle carrying part has first dimensions and a second nozzle carrying part has second dimensions that differ from the first dimensions.

3. The immersion cooling system of claim 1, wherein the one or more nozzles are configurable nozzles, wherein two or more nozzles of the cooling liquid supply are configured differently, such that the first and second nozzle carrying parts are set at different angles at which the nozzle supplies cooling liquid and/or have the diameter of the nozzle and/or the spray type of the respective first and second nozzles be different than the other, wherein the one or more nozzles directed at a first hardware position are configured differently from the one or more nozzles directed at a second hardware position, wherein the one or more nozzles are directed at predetermined locations of the hardware positions based on a heating profile of the hardware component in use, and wherein the one or more nozzles are set to direct a flow of the cooling liquid such that the flow substantially follows at least part of the geometrical shape of the hardware component at least one of the hardware positions.

4. The immersion cooling system of claim 1, wherein the cooling liquid supply has:

a vertical part positioned along a wall of the reservoir, wherein two cooling liquid supplies have different lengths of the vertical part, wherein the vertical part has one or more nozzles directed at least one of the hardware positions, the nozzle preferably directed in a sideward direction; and/or a horizontal part that has one or more nozzles directed at least one of the hardware positions, the horizontal part connected to a distal end of a vertical part, the horizontal part extending underneath at least one of the hardware positions.

5. The immersion cooling system of claim 1, wherein the hardware positions are adjacent positions, configured to form a row of hardware positions for the hardware components, wherein a top side of the hardware positions is near a surface of the immersion liquid held in the reservoir.

6. The immersion cooling system of claim 1, wherein the manifold has pre-formed outlets at multiple hardware positions, the outlets being arranged to couple individualized nozzle carrying parts of the cooling liquid supply.

7. The immersion cooling system of claim 1, wherein the outlet comprises an overflow weir for draining liquid from the reservoir, wherein the overflow weir comprises a vertical wall structure and an overflow lip.

8. The immersion cooling system of claim 1, wherein the outlet comprises at least two overflow weirs for draining liquid from the reservoir, wherein a rectangular shaped reservoir is surrounded, at least on two sides, by the at least two overflow weirs.

9. The immersion cooling system of claim 1, further comprising a filler body placeable in a space between a bottom side of the immersed hardware component and a bottom of the reservoir, wherein a height of the filler body correlates with a distance between the bottom side of the hardware component and the bottom of the reservoir and wherein the filler body generally fills said distance, wherein the filler body comprises polypropylene which is resistant to the cooling liquid and the temperature of the cooling liquid in the reservoir, wherein one or more nozzles of the cooling liquid supply filler body are positioned between the filler body and the hardware component, and wherein preferably the reservoir and filler body have a tongue-and-groove joint for positioning the filler body.

10. The immersion cooling system of claim 1, wherein the reservoir comprises a groove extending vertically along a side wall of the reservoir, the groove receiving a part of the cooling liquid supply.

11. The immersion cooling system of claim 1, wherein the reservoir comprises multiple grooves extending vertically along a side wall of the reservoir forming at multiple hardware component positions a holding space for a side edge of the hardware component.

12. The immersion cooling system of claim 1, wherein the immersion cooling system is modular, and wherein the cooling liquid supply comprising a first reservoir connection point is configured to be connectable to a second reservoir connection point of a second reservoir.

13. The immersion cooling system of claim 1, further comprising at least one hardware component immersed in the cooling liquid at one of the hardware positions, wherein the cooling liquid supply is adapted to one or more properties of said at least one hardware component.

14. The immersion cooling system of claim 13, wherein said at least one hardware component has a heating profile and wherein the one or more nozzles of the cooling liquid supply are set based on the heating profile of said at least one hardware component.

* * * * *